United States Patent [19]

Holmen et al.

[11] Patent Number: 4,784,721

[45] Date of Patent: Nov. 15, 1988

[54] INTEGRATED THIN-FILM DIAPHRAGM; BACKSIDE ETCH

[75] Inventors: James O. Holmen, Minnetonka; Steven D. James, Edina; Jeffrey A. Ridley, Burnsville, all of Minn.

[73] Assignee: Honeywell Inc., Minneapolis, Minn.

[21] Appl. No.: 158,824

[22] Filed: Feb. 22, 1988

[51] Int. Cl.[4] .................. H01L 21/306; B44C 1/22; C03C 15/00; C23F 1/00
[52] U.S. Cl. .................. 156/647; 29/621.1; 156/653; 156/656; 156/657; 156/659.1; 156/662; 252/79.2; 252/79.4; 252/79.5; 338/2; 338/42; 357/26; 73/715
[58] Field of Search .............. 156/647, 648, 652, 653, 156/656, 657-659.1, 661.1, 662-665; 29/610 SG, 620; 338/2, 4, 42; 252/79.2, 79.4, 79.5; 357/4, 26, 28; 73/700, 715, 719, 720, 725, 726

[56] References Cited

U.S. PATENT DOCUMENTS 4,618,397 10/1986 Shimizu et al. ............... 156/647 X
4,721,938 1/1988 Stevenson .................... 156/647 X
4,732,647 3/1988 Aine ......................... 156/647 X

OTHER PUBLICATIONS

S. Sugiyama et al., "Micro-Diaphragm Pressure Sensor", IEDM, 1986, pp. 184-187.

Primary Examiner—William A. Powell
Attorney, Agent, or Firm—Omund R. Dahle

[57] ABSTRACT

A microbridge air flow sensor having a silicon nitride diaphragm formed on the surface of a single crystal silicon wafer. A rectangular 500 angstrom thick sacrificial layer was deposited on the silicon surface before the silicon nitride to define the exact position of the diaphragm. A series of etches from the backside of the wafer is performed to fabricate the device. A first silicon anisotropic etch from the backside is stopped at the sacrificial layer. A sacrificial layer selective etch is applied from the backside first pit to the sacrificial layer to remove all of the rectangular sacrificial layer. Anisotropic etch is again applied into the space created by the removed sacrificial layer whereby the second etch attacks the silicon exposed by the removal of the sacrificial layer and etches downward forming a second anisotropic etch pit. Thus all the etches are from the backside of the silicon wafer.

13 Claims, 4 Drawing Sheets

INTEGRATED THIN-FILM DIAPHRAGM; BACKSIDE ETCH

BACKGROUND AND SUMMARY OF THE INVENTION

The invention is directed to the field of microsensor mass air flow devices and a method of fabricating the devices. The structure at an intermediate point of fabrication is a single crystal silicon substrate chip having on a portion of the surface a thin sacrificial layer of nickel-iron, titanium-tungsten, chrome, aluminum or other selectively etchable layer which delineates the future location of a web or diaphragm to be formed at a later step. The sacrificial layer and the rest of the silicon chip surface are coated with a thin film of silicon nitride which forms the diaphragm. By sacrificial layer is meant a layer which is removed at a later stage in the fabrication process. In this invention the pit or cavity in the silicon beneath the diaphragm is formed by backside etching. In this invention a precisely defined web or diaphragm area can be fabricated by backside etching without regard to dimensional variations of the backside etch pattern or tolerance variations in the thickness of the silicon wafer and without the necessity of accurate alignment of backside features with front side features. It is not necessary to dope the silicon to achieve the desired precision of position and area of the web.

In the fabrication of a thin film web on the surface of a silicon wafer for the emplacement of a sensing thin film material such as in an airflow sensor using heated resistors, it is necessary to accurately reproduce the area, shape, and position of the web. In the simple backside etching technique of prior art it is quite difficult to accomplish this by the usual photolithographic techniques because of difficulties in aligning front features with back features on the opaque wafer, and because wafer thickness variations directly affect the area defined for the web on the front surface.

One prior art improvement on this situation as shown in FIG. 1 is to heavily dope with boron an area that accurately defines the web and allow the backside etch pit apex to fall on the boron etch-stop area comfortably outside the defined web area. However, the thickness of the doped layer can only be a few microns and may not supply the desired rigidity in the web support, and may not supply as much thermal heat sinking as would be desired at the edge of the web if thick silicon were present.

DESCRIPTION

Figure 1:
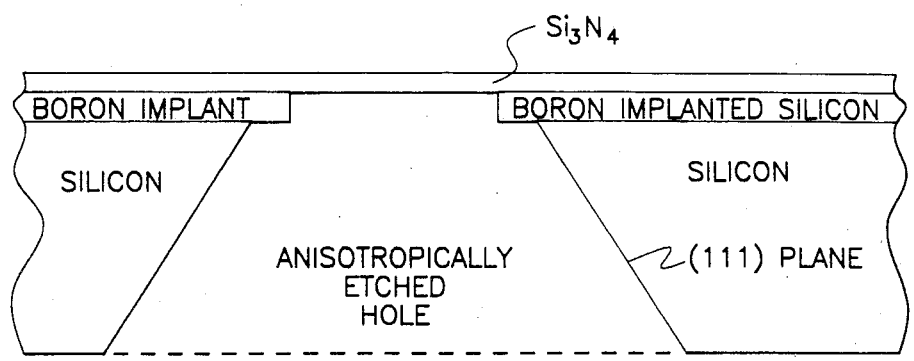
FIG. 1 is a prior art method of controlling backside etching.
Figure 2:
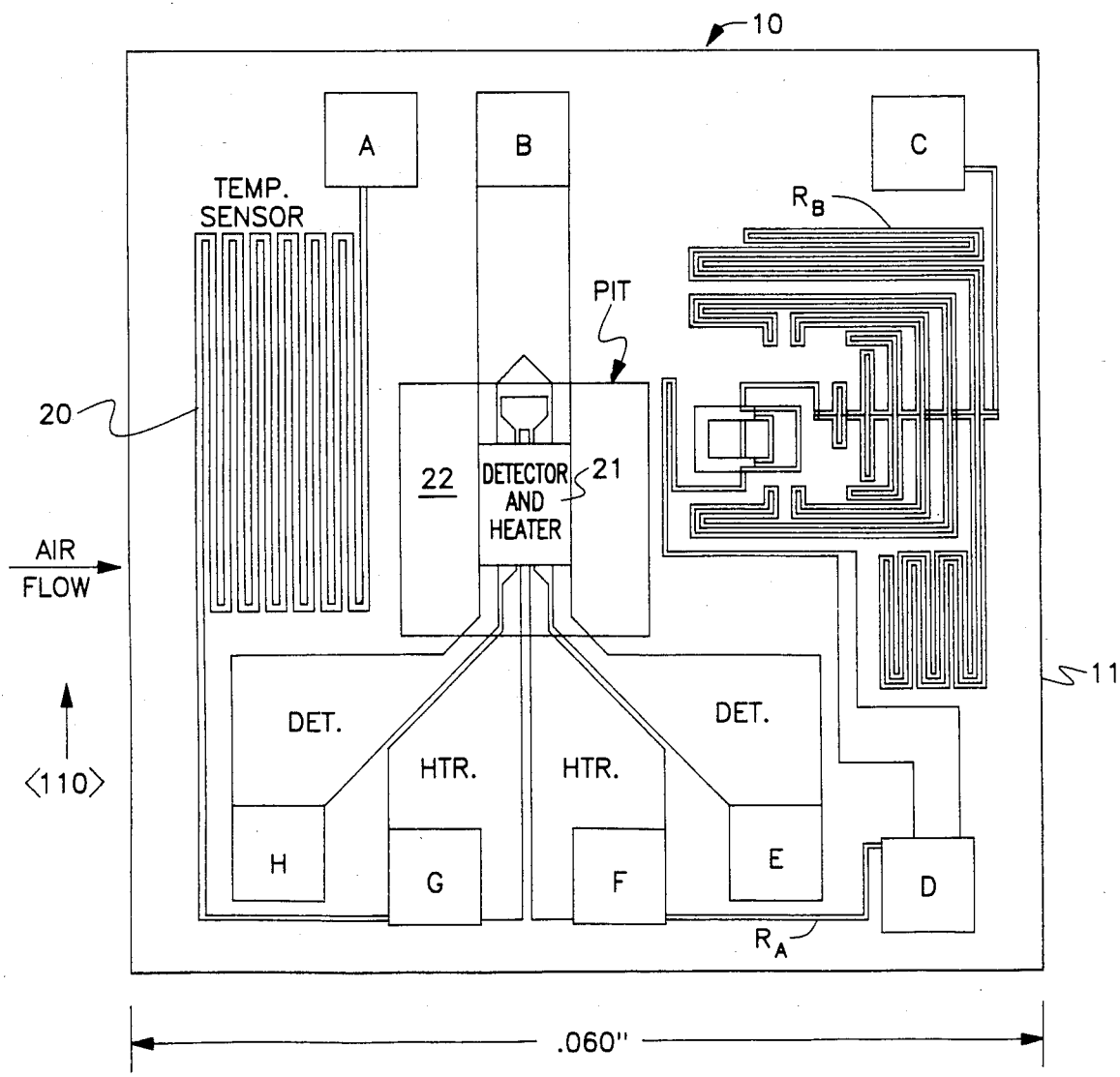
FIG. 2 is a plan view of a microsensor chip according to the invention.
Figure 3:
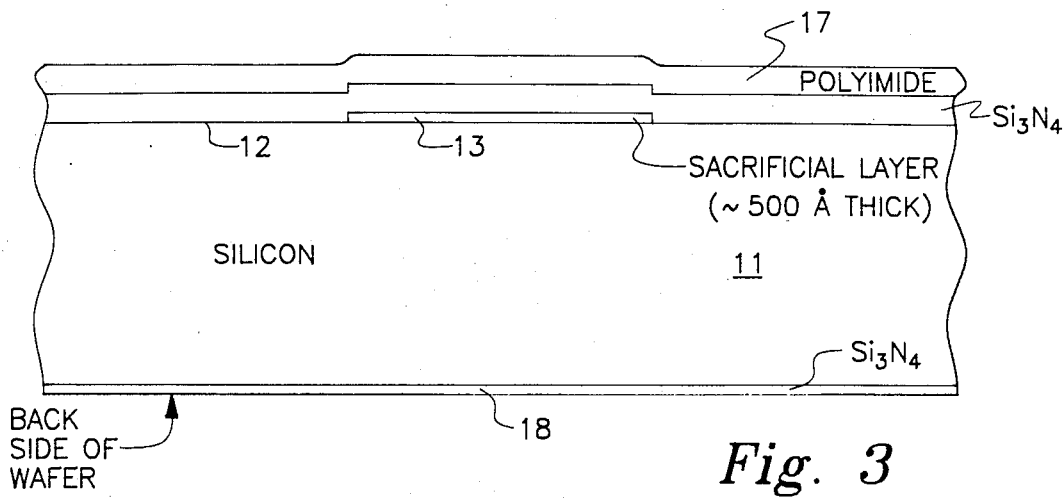
FIG. 3 is a plan view of a portion of the chip prior to backside etching in the silicon.
Figure 3A:
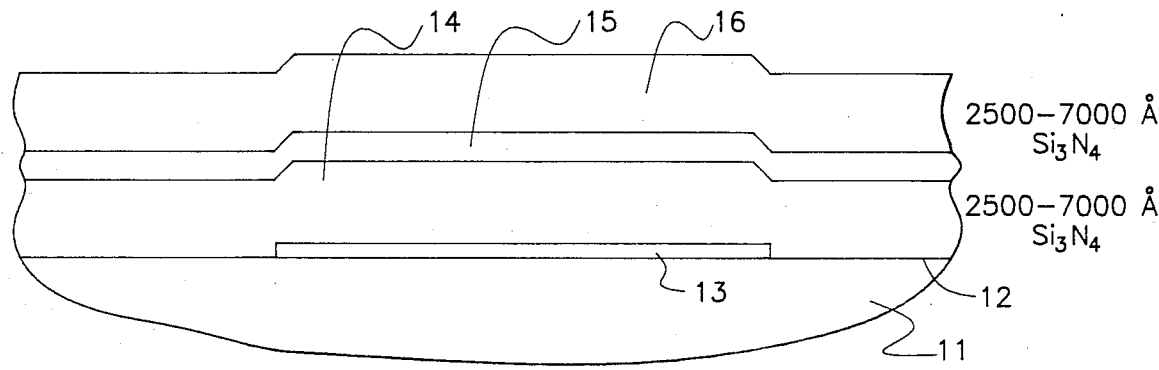
FIG. 3a shows a section of FIG. 3.

Referring now to FIG. 2 there is shown generally at 10 the top plan view of the thin film microsensor chip for air flow sensing constructed on a (100) monocrystalline silicon chip or wafer substrate 11. Referring momentarily to FIGS. 3 and 3a there is shown several of the thin film layers which are not apparent in FIG. 2. Furthermore FIG. 3 is the structure at an intermediate step in the fabrication prior to removal of the sacrificial layer and etching of a pit in the silicon. The monocrystalline silicon substrate wafer 11 has a (100) planar surface 12 which has first formed thereon a thin sacrificial selectively etchable layer such as of sputter deposited Ti:W, Cr, or NiFe 13 preferably about 500-1000 angstroms in thickness. In one successful embodiment the layer 13 is a square about 325 microns($\mu$) on a side. The sacrificial layer 13 defines the location of an area where a pit will later be etched in the silicon. The critical edges of the sacrificial layer delineation are oriented orthogonally to the $<110>$ direction to accurately define the final etch pit boundaries. If a non-orthogonal orientation were used, the sacrificial layer delineation itself would not then limit the boundaries of the etch pit. Over the surface 12 and the sacrificial layer 13 is sputter deposited a thin film layer of dielectric 14 (FIG. 3a) such as silicon nitride which may be on the order of 2500 to 7000 angstroms (Å) thick. A thin film electrically resistive layer such as platinum 15 is sputter deposited over the silicon nitride layer 14 and is delineated by conventional techniques into the desired circuit pattern for the chip. The platinum film is preferably on the order of 800 angstroms in thickness. No sloped edge is needed to carry the resistor line over the nitride step because the initial sacrificial layer step is small and can easily be covered with nitride, and the metal resistor line can be deposited over the resulting 500Å vertical nitride step to achieve electrical continuity and chemical passivation. Following delineation of the circuit a further thin film layer 16 of sputter deposited silicon nitride covers the resistive circuit and the layer 14. An optional layer of polyimide 17 may be deposited over layer 16. A thin layer of silicon nitride 18 also covers the backside of the wafer.

Referring back again to FIG. 2 there is shown near the periphery of the chip a number of electrical contact pads A,B,C,D,E,F,G&H. These pads make selective contact to circuit elements on the chip. For example, a resistive temperature sensor 20 extends between pad A and pad G; a resistor $R_A$ extends between pad F and pad D; and a resistor $R_B$ extends between pad C and pad D. The resistor $R_B$ is in the form of a conventional ladder trip network. All of these resistive element including 20, $R_A$ and $R_B$ as well as a heater and detector (shown a 21) to be described later, are formed in the platinum layer 15, previously identified. The heater and detector 21 are formed in a thin web or diaphragm area 22 over an etched pit in the silicon which is shown in more detail in FIGS. 4, 5 and 7.

Figure 6:
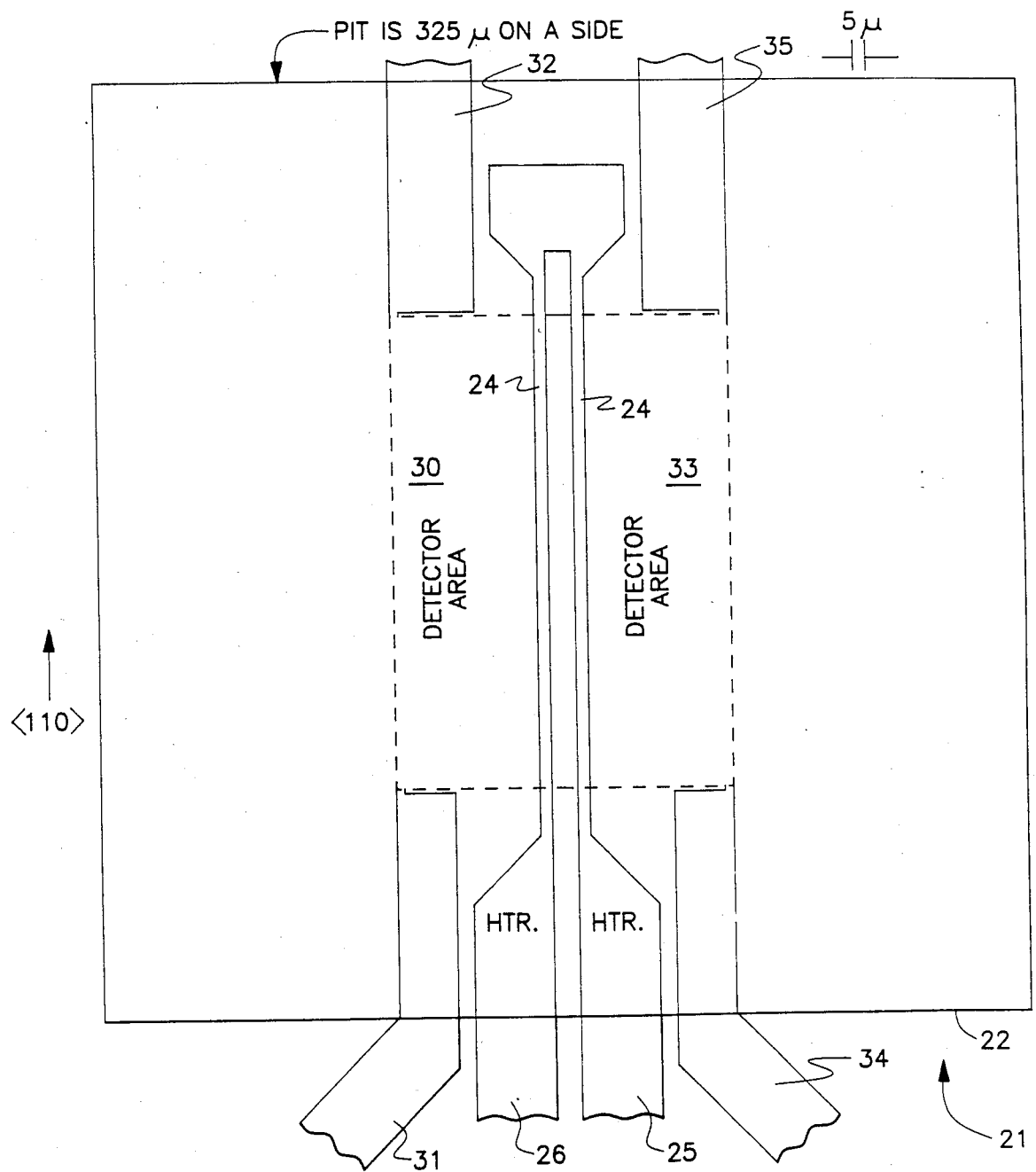
FIG. 6 is a plan view of the diaphragm or web area over the etched pit in the silicon.

In FIG. 6 there is shown a more detailed top plan view of the nitride web area 22 which in one preferred embodiment is about 325 microns on a side. FIG. 6 shows a heater 24 with its leads 25 and 26, an upstream detector area 30 with its leads 31 and 32, a downstream detector area 33 with its leads 34 and 35.

Figure 7:
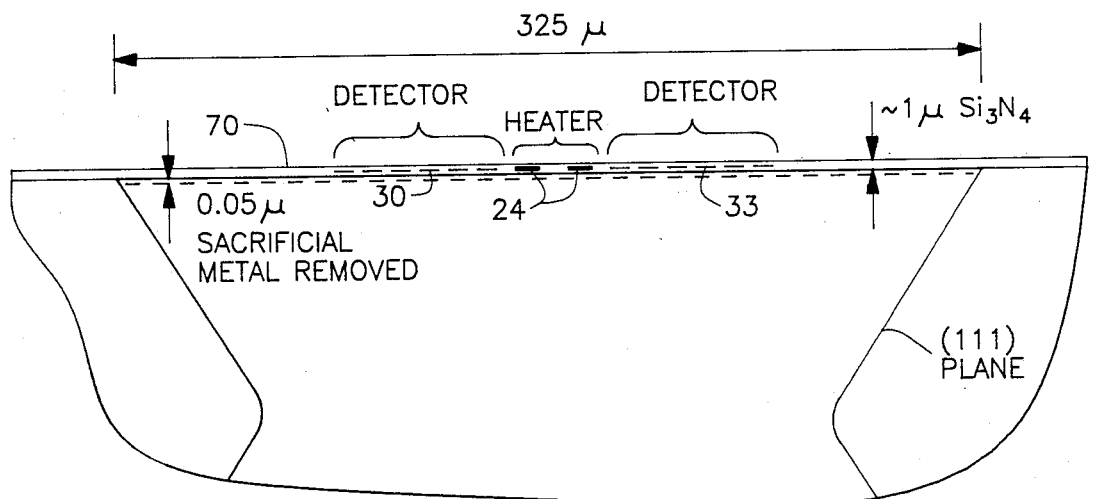
FIG. 7 is a cross section of the diaphragm and etched pit of FIG. 6.

FIG. 7 is a cross-section of the silicon nitride web area 22 shown in FIG. 6. The heater 24 and detectors 30 and 33 and thin encapsulating silicon nitride film 70 (same as 14,16) on the web area are deposited by conventional thin film techniques as described in earlier patents assigned to the same assignee as the present invention, such as U.S. Pat. Nos. 4,478,076; 4,478,077; 4,501,144; 4,581,928; and 4,651,564.

A heated element air flow sensor must retain a constant thermal conductance structure over its life to maintain its initial calibration. The accumulation of contaminating films or dirt underneath the web structure during life can change the conductance to the silicon and cause error in the calibration. An object of the invention is to effectively seal off the pit space beneath the heater and detectors (i.e., the web) from the airflow to prevent such contamination by using a novel back surface etching procedure.

EXAMPLE 1

Figure 4:
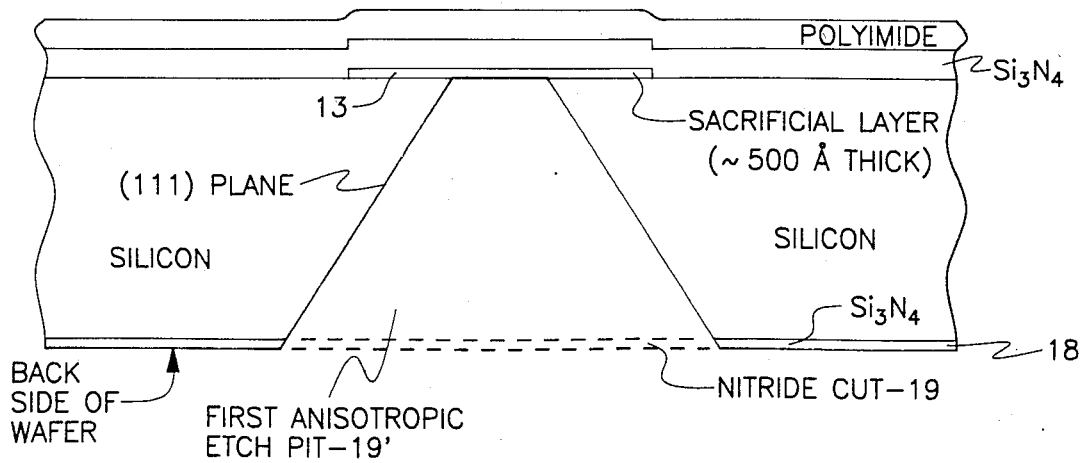
FIG. 4 shows the chip following the first anisotropic backside etch.
Figure 5:
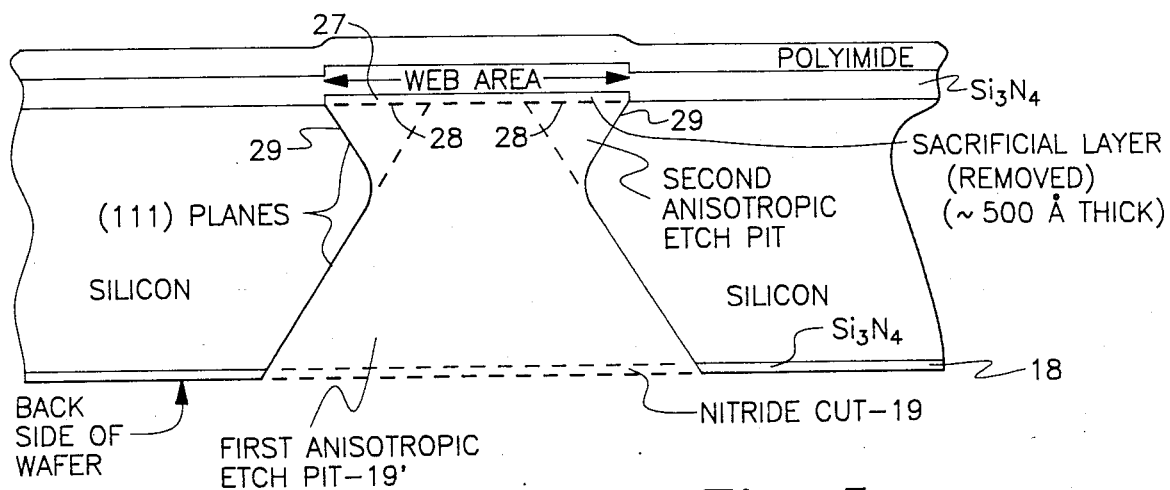
FIG. 5 shows the chip and diaphragm following the sacrificial metal etch and the second anisotropic silicon etch.

In a first embodiment the backside etching method proceeds substantially as follows. The device of FIG. 3 first has a nitride cut 19 made on the backside of the wafer to expose an area of the silicon 11 (see FIG. 4). The preferred pattern of the nitride cut is rectangular or square and is orthogonal to the <110> direction. An anisotropic KOH alkaline etchant is applied to the backside to anisotropically etch a first etch pit 19' into the silicon until the sacrificial layer is reached. In this first example the sacrificial layer 13, such as of Ni-Fe, Cr, Ti:W or the like acts as an etch stop for the anisotropic etch used to define the backside cavity. Thus the first anisotropic etched pit is formed with its truncated apex somewhere near the middle of the web area as shown in FIG. 4. The etching action stops when the sacrificial layer is reached, and is limited on the sides by the highly resistant (111) planes of the silicon. In the method of the invention the sacrificial layer is used to accurately define the area of the diaphragm or web. The pattern of the sacrificial layer is square or rectangular with the sides oriented orthogonal to the <110> direction in the silicon.

In this invention the edge of the pit and hence the length of the bridge are determined by the (111) plane stopping action. This is made possible by the orthogonal orientation of the rectangularly delineated sacrificial film beneath the orthogonally oriented microbridge structure, as in FIG. 6. A second etch is applied into the first etch it to remove the sacrificial layer. The sacrificial film is completely removed by a selective etchant thus undercutting the microbridge with a thin 500 angstrom space 27 formerly occupied by the sacrificial layer 13. Specific etchants for Ni-Fe, Ti:W and Cr materials are:

For Ni-Fe
   30 parts sulfuric acid
   9 parts water
   1 part conc. hydrogen peroxide
   Room temperature
For Ti:W
   10 parts water
   1 part conc. hydrogen peroxide
   60 degrees C.
For Cr
   181 grams/liter Cerric ammonium nitride
   48 ml/liter acetic acid
   Water to make 1 liter of solution
   Room temperature The silicon anisotropic etch is again applied and can fill the newly formed space 27. It now attacks the (100) silicon 28 that was exposed by the removal of the sacrificial layer, and etches downwardly, forming a second anisotropic etch pit and exposing another set of (111) planes 29, and smoothing the intersections of the two sets of planes to form an hour-glass like hollow beneath the web to provide the desired isolation of the web from the substrate. If desired, the etching can be continued to form a wider pit.

SUMMARY OF FABRICATION STEPS FOR EXAMPLE 1

A summary of the main fabrication steps described above is as follows:

1. Deposit and delineate the 500–1000 angstrom sacrificial layer on the (100) silicon wafer front surface.
2. Deposit about 5000 angstroms of silicon nitride.
3. Deposit and delineate bonding pads, the heater resistor, detector resistors, and circuit resistors.
4. Deposit about 5000 angstroms of silicon nitride.
5. Deposit on the backside a thin film of silicon nitride.
6. Make a cut in the backside silicon nitride to expose an area of the silicon backside.
7. Apply to the exposed silicon backside an anisotropic etch which etches a first anisotropic etch pit reaching through the silicon to the sacrificial layer which acts as a stop.
8. Apply through the first etch pit opening a sacrificial layer selective etch which removes the layer of sacrificial layer.
9. Apply again the silicon anisotropic etch into the space created by the now removed sacrificial layer so that the anisotropic etch now attacks the silicon exposed by the removal of the sacrificial layer and etches anisotropically downwardly forming a second anisotropic etch pit.

EXAMPLE 2

In a second embodiment in which the sacrificial layer 13 is aluminum, the etching process proceeds slightly differently when the anisotropic KOH etchant reaches the sacrificial layer. In the first example the sacrificial layer acted as an etch stop. In this example, the aluminum sacrificial layer is one which is also etched by the KOH etch. This aluminum material is isotropically etched by the KOH at a much higher rate than the KOH etches silicon. Depending on the thickness of the Si wafer, 4–6 hours would be required to etch through the back of the wafer in order to make contact with the sacrificial layer. The etch out of the Al would then proceed very rapidly. For an aluminum film 500Å–1000Å in thickness, this would occur in 1–2 minutes, or less. The etchant then has filled the newly formed space 27. It now attacks the silicon 28 that was exposed by the rapid removal of the aluminum, and etches downwardly forming a second anisotropic etch pit and exposing another set of (111) planes 29 as in the previous example. This portion of the anisotropic etching of silicon would then continue (for 1+ hour) to yield the "hour glass" pit configuration needed for diaphragm isolation.

EXAMPLE 3

Figure 8:
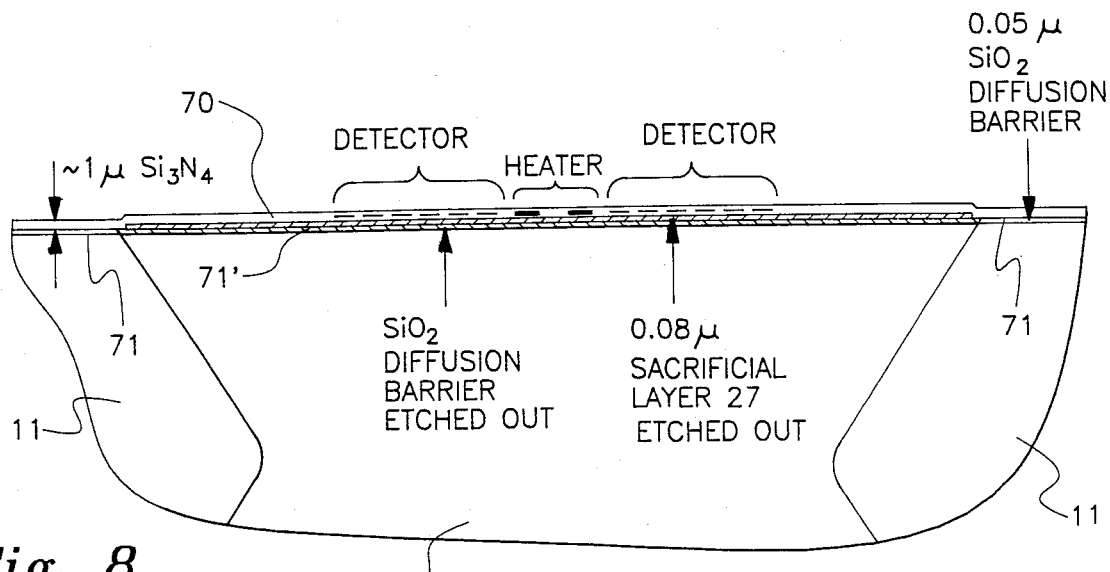
FIG. 8 shows a variation of FIG. 7 in the addition of a diffusion barrier.

A variation of the second embodiment may be desirable when platinum is used for the heater 24, the detectors 30 and 33 and the like. A diffusion barrier is sometimes needed to prevent aluminum or other sacrificial layer metal from reacting with the Si and thereby prevent or inhibit the anisotropic etching of Si. Aluminum (in contact with Si) will form the silicide at 570 degrees C. Since Pt must be annealed at temperatures in excess of this (600–700 degrees C.), aluminum silicide will be formed during the stabilization anneal sequence. The silicide can be difficult to remove and can interfere with the anisotropic Si etch process. A diffusion barrier 71, such as $SiO_2$, can be utilized to prevent silicide formation (see FIG. 8). 500A –1000A (and even less) of $SiO_2$ is effective in isolating the Al from Si. $SiO_2$ can be removed with a standard buffered HF etchant (10:1 BOE). The etch rate of $SiO_2$ in BOE is 500–600A/minute. $SiO_2$ also etches in the standard anisotropic etch solution at 70 A/minute. When the backside etch reaches the diffusion barrier, the $SiO_2$ will be removed (or substantially removed in 10–15 minutes (with a $SiO_2$ thickness of 500A). In the case of sacrificial layer materials such as Ni-Fe, Ti:W, etc., the $SiO_2$ etch-out should be allowed to proceed to (essentially) completion. The sacrificial layer can then be removed with the proper etchant. In the case of aluminum, since all the relevant components are soluble in the hot KOH anisotropic etch solution, the backside etching process will automatically proceed through the various steps - culminating in the final step to etch (downward) from the bottom of the diaphragm, to form the "hour glass" pit structure.

The embodiments of the invention in which an exclusive property or right is claimed are defined as follows:

1. A process for fabricating a thin film microsensor for air flow comprising the steps of:
    providing a single crystal (100) silicon wafer having a front planar surface, a backside surface and having a <110> direction;
    depositing and delineating a rectangular area of a thin film layer of sacrificial selectively etchable material on the silicon front surface;
    depositing a thin film of silicon nitride on the selectively etchable material and the rest of the silicon front surface, the film being thicker than the thickness of the sacrificial material;
    depositing and delineating a thin film of electrically resistive material on the silicon nitride to form desired circuit elements such as detector resistors, circuit resistors and a heater resistor, said heater resistor and detector resistors being located over said sacrificial material area;
    depositing an additional thin film of silicon nitride over the resistive material and the previous silicon nitride;
    depositing a thin film of silicon nitride over the backside surface;
    opening a cut through the silicon nitride on the backside to expose an area of the backside silicon surface, the cut being rectangular and orthogonal to the <110> direction;
    introducing an anisotropic etch to the backside silicon surface at said nitride cut to anisotropically etch a first anisotropic pit through the silicon wafer until the layer of sacrificial selectively etchable material is reached;
    introducing selective etch through the first anisotropic pit to etch out all of the sacrificial selectively etchable material leaving a thin cavity in its place; and,
    introducing the anisotropic etch through the first pit and the thin cavity to anisotropically etch the silicon exposed by the removal of the sacrificial material and form a second anisotropic etch pit.

2. The process according to claim 1 in which said sacrificial selectively etchable material is selected from the group consisting of NiFe, Cr, and Ti:W, and in which said selectively etchable material acts as an etch stop to the anisotropic etch.

3. The process according to claim 2 in which the sacrificial material is NiFe.

4. The process according to claim 2 in which the sacrificial material is Ti:W.

5. The process according to claim 2 in which the sacrificial material is Cr.

6. The process according to claim 1 in which said thin film layer of sacrificial selectively etchable material is about 500–1000 angstroms in thickness.

7. The process according to claim 3 in which said selective etch is 30 parts sulfuric acid, 9 parts water, and 1 part conc. hydrogen peroxide at room temperature.

8. The process according to claim 4 in which said selective etch for Ti:W is 10 parts water, and 1 part conc. hydrogen peroxide at $\sim 60°$ C.

9. The process according to claim 5 in which said selective etch for Cr is 181 grams/liter cerric ammonium nitride, 48 ml/liter acitic acid, and water to make 1 liter of solution at room temperature.

10. The process according to claim 1 in which said anisotropic etch is KOH.

11. The process according to claim 1 in which said sacrificial selectively etchable material is aluminum.

12. The process according to claim 11 in which said anisotropic etch is KOH which is also a selective etch for aluminum whereby the three etching steps are a continuous process.

13. The process according to claim 1 and further comprising the step of:
    forming an oxide diffusion barrier of about 500–1000 angstroms of $SiO_2$ on the front planar surface of the silicon wafer preceding the step of depositing and delineating of the sacrificial selectively etchable material.

* * * * *